United States Patent [19]

Reed et al.

[11] Patent Number: 5,796,655
[45] Date of Patent: Aug. 18, 1998

[54] MEMORY CELL HAVING PROGRAMMED MARGIN VERIFICATION

[75] Inventors: Robert Harrison Reed, Kokomo; Dennis Michael Koglin, Carmel; Mark Billings Kearney, Kokomo, all of Ind.

[73] Assignee: Delco Electronics Corporation, Kokomo, Ind.

[21] Appl. No.: 954,152

[22] Filed: Oct. 20, 1997

[51] Int. Cl.⁶ .................................................. G11C 11/34
[52] U.S. Cl. ............... 365/185.22; 365/188; 365/189.07; 365/201
[58] Field of Search .................. 365/185.22, 201, 365/189.07, 189.09, 188

[56] References Cited

U.S. PATENT DOCUMENTS

| | | | |
|---|---|---|---|
| 5,014,098 | 5/1991 | Schlais et al. | 357/23.5 |
| 5,572,472 | 11/1996 | Kearney et al. | 365/201 |
| 5,592,416 | 1/1997 | Bonitz et al. | 365/201 |

*Primary Examiner*—Vu A. Le
*Attorney, Agent, or Firm*—Jimmy L. Funke

[57] ABSTRACT

A memory cell having programming voltage margin verification is provided. The memory cell includes a voltage comparator having a differential input with first and second inputs and bias circuitry for generating a differential input voltage. A voltage offset is applied to the second input of the comparator to provide an input offset voltage. A programming voltage is received for programming the memory cell and the memory cell provides an output signal. To verify an unprogrammed state voltage margin of the memory cell, a margin detection circuitry receives a verification check signal and the output is monitored to determine whether the unprogrammed state voltage margin is proper. To verify a proper programmed state voltage margin of the memory cell, current is sensed through the programming input and a determination of a proper programmed state voltage margin is determined as a function of the sensed current.

9 Claims, 2 Drawing Sheets

MEMORY CELL HAVING PROGRAMMED MARGIN VERIFICATION

BACKGROUND OF THE INVENTION

1. Technical Field

The present invention relates to a programmable memory cell and, more particularly, to a programmable non-volatile memory cell having programming margin verification.

2. Discussion

Memory cells are commonly used to provide non-volatile data retention for a wide variety of applications. For example, several memory cells in combination with a digital-to-analog converter can be used to generate precise calibration signals for pressure sensors and accelerometer sensors by narrowing binary weighted analog output voltages or currents to meet circuit calibration and functional adjustment requirements. Common calibration signals are used to set offset voltage and gain and often compensate for temperature variations. The generation of calibration signals by programming memory cells can be performed during an electrical test during final assembly or could be performed after assembly by the end user to produce non-volatile calibration voltages and currents.

Conventional techniques for generating calibration factor signals have included the use of programmable metal fuses, zener diode trimming (e.g., zener-zapping) and other well known established non-volatile memory devices such as erasable programmable read only memory (EPROM) and electrically erasable programmable read only memory (EEPROM). One example of a calibration technique is described in issued U.S. Pat. No. 5,572,472, entitled "Integrated Zener-Zap Non-Volatile Memory Cell With Programming and Pretest Capability", issued on Nov. 5, 1996 to the assignee of the present application. The aforementioned issued patent is incorporated by reference herein.

The above-identified zener zap technique uses an array of zener diodes to trim in a value by selectively shorting out (zapping) the junctions of diodes that are in parallel with certain resistors. This process effectively removes the resistor from the circuit. However, this generally requires large resistor values and also requires relatively high current levels to short out the diode junction. The above-identified zener zap technique also includes a pretest capability wherein a lower voltage input is applied to a designated memory cell to check if the desired programmed state is appropriate, and if so applies a higher voltage to zap the zener diode and thereby provide permanent programming to the memory cell. One example of an EEPROM memory is disclosed in U.S. Pat. No. 5,014,098 to Schlais, entitled "EPROM in Double Poly High Density CMOS". More recently, metal oxide semiconductor (MOS) non-volatile memory cells have been developed which utilize programmable MOS transistors (PMT). Examples of electrically programmable MOS transistor-based memory cells are disclosed in co-pending patent application Ser. No. (Delco Case No. H-188616), entitled "EPROM in Double Poly High Density CMOS", Ser. No. Delco Case No. H-194837), entitled "EPROM in High Density CMOS Having Added Substrate Diffusion", and U.S. Ser. No. (Delco Case No. H-194838), entitled, "EPROM in High Density CMOS With Metallization Capacitor", all of which are assignable to the Assignee of the present invention. The aforementioned co-pending patent applications are incorporated herein by reference. PMT devices utilize and the MOS memory cell can utilize floating gate avalanche injection MOS (FAMOS) technology.

While programming of memory cells is achievable with the above-identified memory circuits, it has become desirable to more easily verify that the programmed threshold voltage or voltage margin has been properly effected. In the past, voltage margin verification techniques have included checking the state of the transistors. Conventional verification approaches can be time consuming and can be intrusive to the circuit. An easier and non-intrusive approach is desired.

It is therefore desirable to provide for a memory cell having programming voltage margin verification that is easy and non-intrusive. It is particularly desirable to provide for programming margin verification for a metal oxide semiconductor non-volatile memory cell which utilizes programmable MOS transistors. It is further desirable to provide for such a memory cell with programming margin verification that allows for programmed condition verification for both the programmed state and unprogrammed state of the memory cell.

SUMMARY OF THE INVENTION

In accordance with the teachings of the present invention, a memory cell having programming margin verification is provided. A voltage comparator is included having a differential input with first and second inputs. Bias circuitry generates the differential input. A voltage offset is applied to the second input of the comparator to provide an input offset voltage. A programming voltage is received for programming the memory cell and the memory cell provides an output signal. To verify an unprogrammed state voltage margin of the memory cell, margin detection circuitry receives a verification check signal and the output is monitored to determine whether the unprogrammed state voltage margin is proper. To verify a proper programmed state voltage margin of the memory cell, current is sensed through the programming input and a determination of a proper programmed state voltage margin is determined as a function of the sensed current.

BRIEF DESCRIPTION OF THE DRAWINGS

Other objects and advantages of the present invention will become apparent to those skilled in the art upon reading the following description and upon reference to the drawings in which.

DETAILED DESCRIPTION OF THE PREFERRED EMBODIMENT

Figure 1:
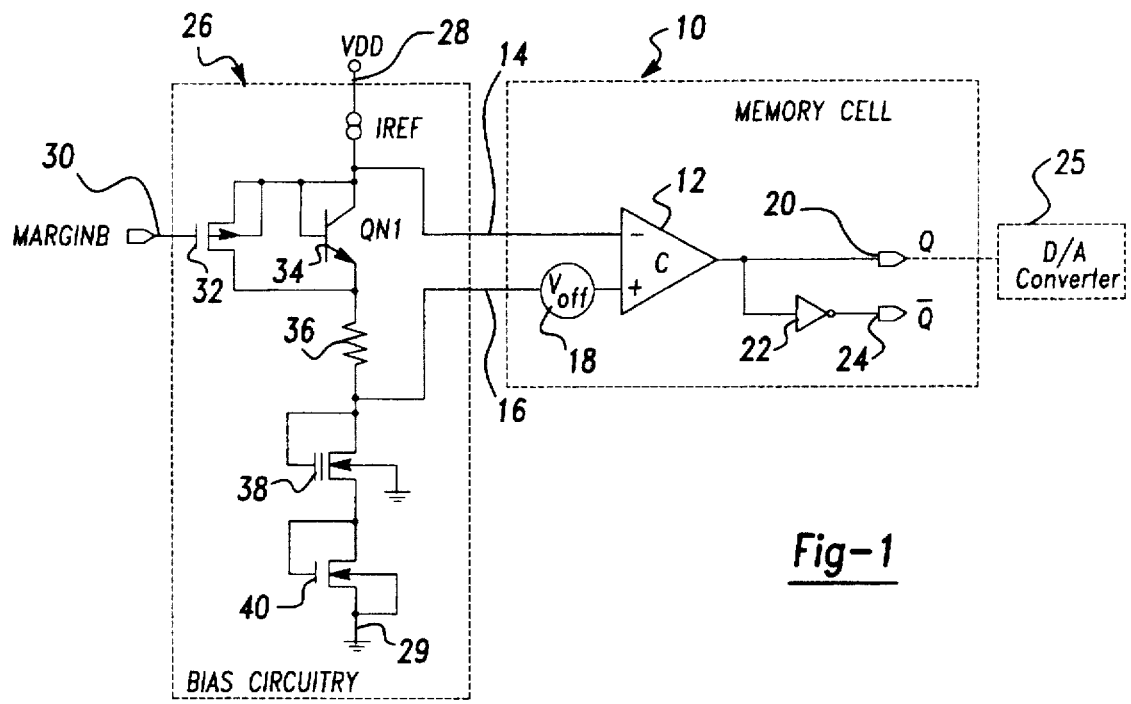
FIG. 1 is a circuit diagram illustrating a programmable MOS transistor-based memory cell with bias circuitry according to the present invention.

Turning now to FIG. 1, a memory cell 10 is shown in combination with a portion of bias circuitry 26 for providing memory cell programming and programming voltage margin verification in accordance with the present invention. The memory cell 10 is preferably a metal oxide semiconductor (MOS) non-volatile memory cell utilizing programmable MOS transistors (PMT) and is preferably fabricated in a high-performance CMOS wafer process. The programmable MOS transistors (PMTs) preferably utilize floating gate avalanche injection MOS (FAMOS) technology and can be fabricated with other n-channel transistors, p-transistors, and standard integrated circuit elements. The programmable MOS transistors are one-time programmable n-channel enhancement transistors which generally require no additional masking levels or process steps. While one example of a memory cell 10 is discussed herein, it should be appreciated that other memory cells may be used in connection with the programming voltage margin verification of the present invention.

The preferred memory cell 10 includes a comparator (C) 12 having an inverting input (−) coupled to line 14 and a non-inverting input (+) coupled to line 16 via a voltage offset ($V_{off}$) 18. Lines 14 and 16 supply a differential input voltage from bias circuitry 26 to comparator 12 with the addition of the voltage offset ($V_{off}$) applied to the non-inverting input of comparator 12. In response, comparator 12 produces a memory cell output Q on output pin 20. Memory cell 10 further includes an inverter 22 coupled to pin 20 for supplying an inverted memory cell output $\bar{Q}$ on pin 24. When biased, the unprogrammed memory cell 10 has an output Q with a logic "0" output. Upon programming, the memory cell 10 has an output Q on pin 20 with a logic "1" output.

Output pin 20 of memory cell 10 is shown connected to a digital-to-analog (D/A) converter 25 in accordance with one application. The digital-to-analog converter 25 provides an analog output signal that can be used to precisely calibrate sensors, such as providing gain and offset calibration as well as temperature compensation. However, output Q can be supplied to various other devices as should be evident to one in the art.

The bias circuitry 26 includes MOS transistor 32 with a gate for receiving a verification check signal identified as MARGINB on verification check input line 30. Bias circuitry 26 further includes an NPN bipolar junction transistor (BJT) 34 having a collector coupled to current source $I_{REF}$ with the collector further coupled to both the base of transistor 34 and the source of transistor 32. In addition, transistor 34 has an emitter tied to the drain of transistor 32. The collector terminal of transistor 34 supplies a voltage input identified as INPROG on line 14 as an input to comparator 12. Bias circuit 26 further includes a gate-drain connected programmable MOS transistor 38 having a drain coupled to both the drain of transistor 32 and the emitter of transistor 34 via resistor 36. The drain terminal of transistor 38 supplies a second voltage input identified as INBIAS on line 16 which is offset by voltage offset ($V_{off}$) 18 and applied to the non-inverting input of comparator 12. Programmable MOS transistor 38 has a gate tied back to the drain thereof and further has a source coupled to the drain of a gate-drain connected MOS transistor 40. Transistor 40 has a gate tied back to the drain thereof and has a source connected to ground 29.

The gate-drain connected transistors 40 and 38 are biased by current $I_{ref}$ and provide bias voltage to the non-inverting input 16 of the memory cell 10. The differential input bias voltage across transistor 34 and resistor 36 is developed by the bias current $I_{ref}$. Resistor 36 is preferably a diffused resistor exhibiting a positive temperature coefficient of resistance. Accordingly, bias current $I_{ref}$ possesses a slight positive temperature coefficient resulting in a voltage drop across resistor 36 with a positive temperature coefficient of voltage. This voltage combined with the approximately −2.2 mV per degrees celsius of temperature coefficient of on-voltage of the diode-connected transistor 34 yields a differential input bias voltage with a net negative temperature coefficient of voltage. The sum of the input offset voltage of the memory cell 10 with the differential bias voltage yields an effective memory cell offset voltage that is relatively invariant with respect to temperature and process variations.

Figure 2:
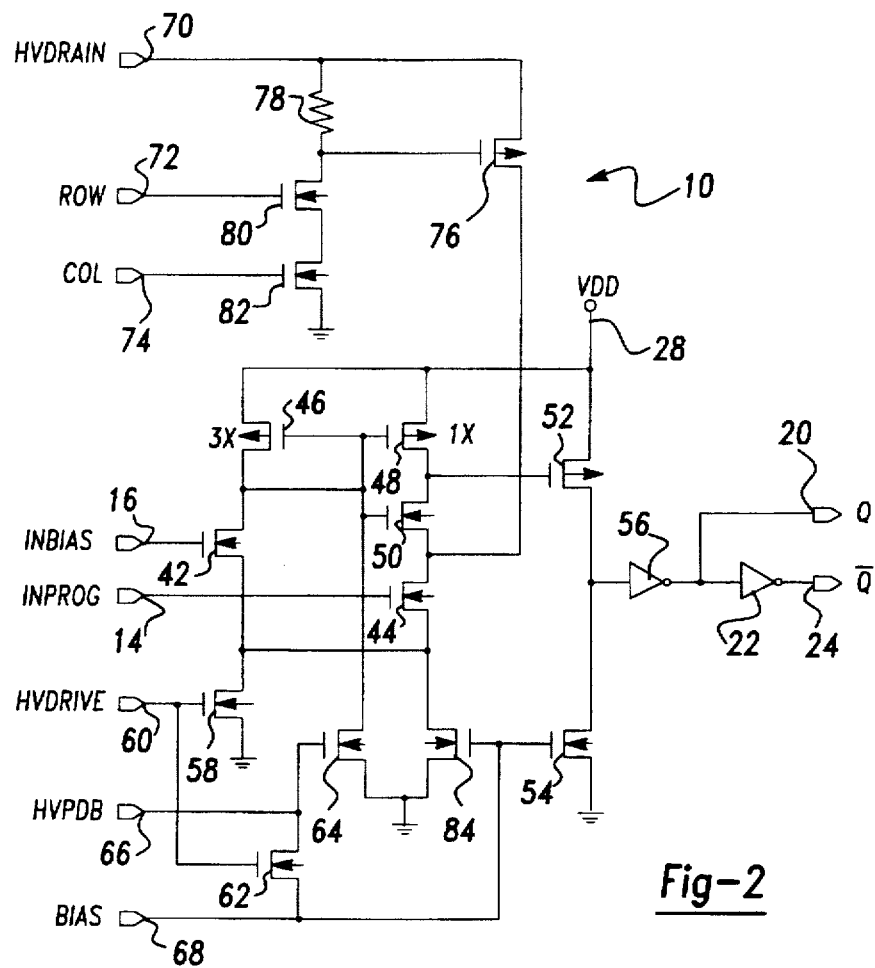
FIG. 2 is a circuit diagram further illustrating the memory cell of FIG. 1.

With particular reference to FIG. 2, the memory cell 10 is further shown in greater detail. Memory cell 10 further includes row and column decoding inputs on lines 72 and 74, respectively. Memory cell 10 is preferably fabricated in an electronically programmable memory array and is individually addressable via the row and column decoding. The memory cell 10 is addressed when the corresponding row and column decoding lines address that particular memory cell. Row and column address decoding may be achieved in a manner similar to that described in pending application Ser. No. 08/423,008, DE No. H-188716 entitled "Analog Voltage Address Decoder Circuit", which is also incorporated herein by reference.

Memory cell 10 includes transistors 76, 80 and 82. Transistor 82 has a gate coupled to column decode input line 74, a source coupled to ground and a drain coupled to the source of transistor 80. Transistor 80 further has a gate coupled to row decode input line 72 with a drain coupled to the gate of transistor 76 and further coupled to HVDRAIN input line 70 via resistor 78. Transistor 76 is also coupled to HVDRAIN line 70 and has a drain connected to the comparator circuit 12.

The comparator circuit 12 is shown to include an input PMT transistor 42 with a gate coupled to input line 16 and an input PMT transistor 44 having a gate coupled to input line 14 for receiving inputs INBIAS and INPROG, respectively. A current mirror is configured with gate connected transistors 46 and 48. Transistors 46 and 48 both include sources coupled to supply voltage $V_{DD}$ input line 28. The drain of transistor 46 is coupled to the drain of transistor 42, while the source of transistor 42 is coupled to the drain of a transistor 58. Transistor 58 further has a gate coupled to input line 60 for receiving HVDRIVE signal and has a source coupled to ground. The HVDRIVE signal is also applied to the gate of transistor 62 which in turn has a source coupled to input 68 and a drain coupled to the gate of transistor 64. Transistor 64 has a drain coupled to the gate connection of the current mirror as well as coupled to the gate of transistor 50 and drain-of transistor 46. The source of transistors 64 and 84 are both coupled to ground.

Transistor 50 has a drain coupled to the drain of transistor 48 and a source coupled to the drain of transistor 44. The drain of transistor 44 is also connected to the drain of transistor 76, while the source of transistor 44 is coupled to the drain of transistor 84. Transistor 84 has a gate commonly tied to the gate. of transistor 54 as well as input 68. Transistor 54 has a drain coupled to the drain of transistor 52 and also to the input of inverter 56, while the source of transistor 54 is tied to ground. Transistor 52 has a source coupled to supply voltage $V_{DD}$ input line 28. Inverter 56 inverts the input signal and outputs the inverted signal as output Q on pin 20. The inverted signal is also input to inverter 22 which in turn supplies an inverted output signal $\bar{Q}$ on pin 24.

Accordingly, memory cell inputs INBIAS and INPROG drive the gates of the matched pair of PMT input transistors 42 and 44. Transistors 46 and 48 provide the current mirror load and are preferably designed such that transistor 46 has three times the aspect ratio of transistor 48. With equal input voltages on INPROG and INBIAS, the area mismatch of transistors 46 and 48 forces a bias current offset through the legs transistor 46/transistor 42 and transistor 48/transistor 50/transistor 44. This bias current mismatch results in a systematic input offset voltage at the memory cell inputs INBIAS and INPROG. Transistor 50 is cascode connected and provides isolation from high voltages employed during programming. An analysis of the circuit shows that with equal comparator input voltages, the ratio of the comparator leg currents is nominally nine-to-one according to the present example. Area ratioing of transistors 46 and 48 results in a larger current flowing across transistor 46/transistor 42. The net result of this bias condition is that transistor 44 is in the linear region thus forcing the transistor 52 gate voltage low. Inverting gain stage transistor 52/transistor 54 forces the input of inverter 56 to a logic "1" which results in a logic "0" output on output Q on pin 20. The memory cell differential input voltage provided by the bias circuitry 26 augments the input offset condition and results in an offset voltage of nominally one volt plus or minus 0.2 volts according to the present example.

Programming of the memory cell 10 and thus toggling memory cell output Q on pin 20 from logic "0" to logic "1" requires an elevated voltage on the memory cell input pins 70, 60 and 14, corresponding to signals HVDRAIN, HVDRIVE AND INPROG, respectively. To select a particular memory cell for programming, the corresponding row and column decode input signals must be forced to logic "1". Selecting a memory cell as described above with a low voltage applied to HVDRAIN toggles the memory cell output voltage Q on pin 20 to a logic "1". This soft-calibration feature allows a user to evaluate the circuit effects of programming the memory cell 10 without actually programming the cell permanently. In addition, the soft-calibration feature allows the user to determine if the memory cell is defective, i.e., in the wrong state, by verifying an output stage change upon addressing.

With supply voltage $V_{DD}$ on HVDRAIN and row decode input 72 and column decode input 74 asserted high, transistor 76 drain pulls the source of transistor 50 to supply voltage $V_{DD}$. This action turns transistor 50 "off" and forces the current source transistor 48 into compliance. With the gate of transistor 52 at the supply voltage $V_{DD}$, memory cell output Q on pin 20 toggles to logic "1".

Figure 3:
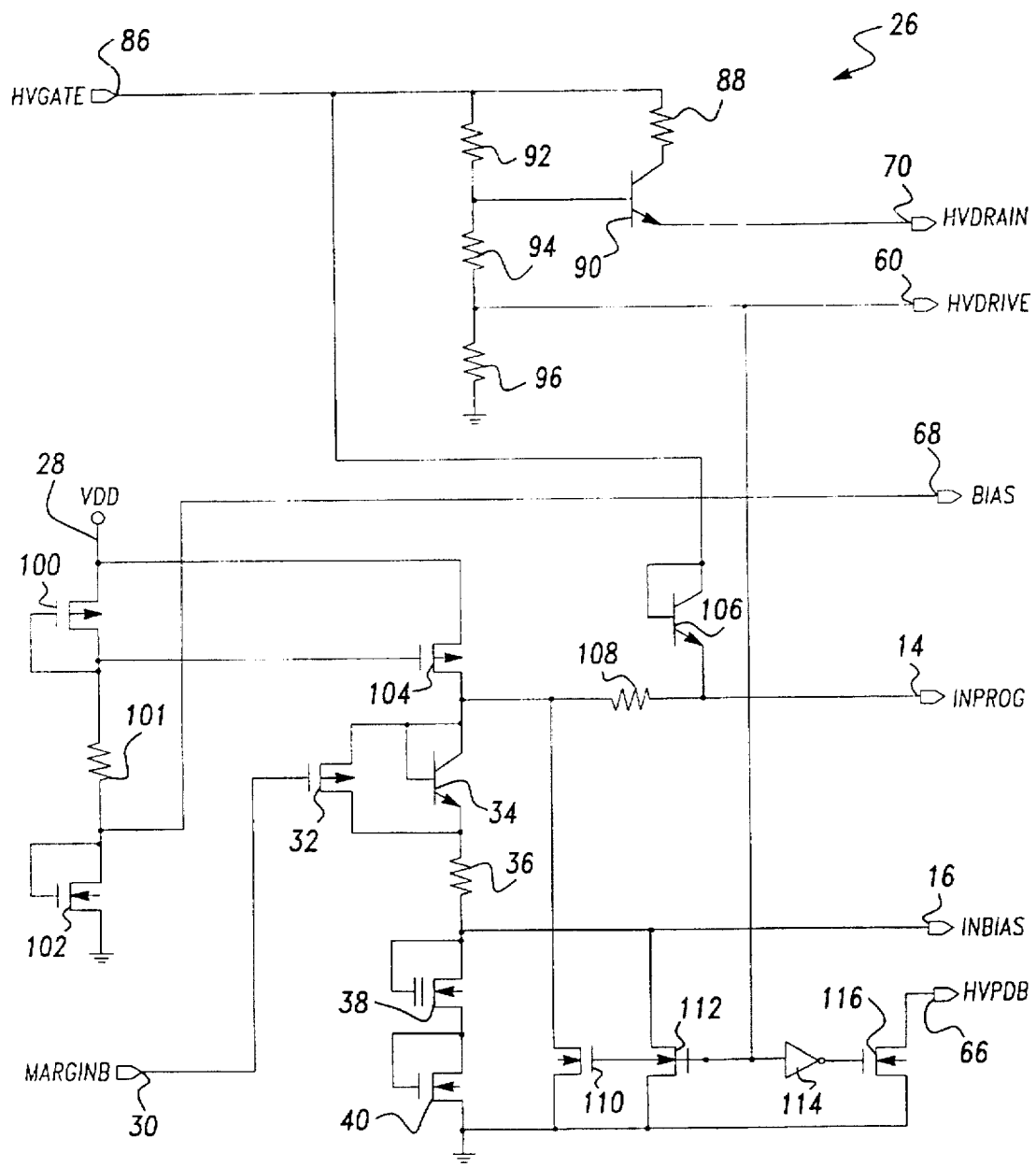
FIG. 3 is a circuit diagram further illustrating the bias circuitry in accordance with the present invention for achieving programming voltage margin verification.

Referring to FIG. 3, the bias circuitry 26 is further illustrated in greater detail. As previously described, bias circuitry 26 includes transistors 32, 34, 38 and 40, as well as resistor 36 and receives input signal MARGINB. In addition, bias circuitry 26 further includes transistors 100 and 104, each having a source coupled to supply voltage $V_{DD}$ line.28. Transistor 100 has a gate coupled back to its drain which is further coupled to the gate of transistor 104. The drain of transistor 104 in turn is coupled to the collector of transistor 34 and further coupled to line 14 via resistor 108. The drain and gate of transistor 100 are coupled to the drain and gate of transistor 102 via resistor 101, while the source of transistor 102 is coupled to ground.

The bias circuitry 26 further includes a high voltage gate input 86 for receiving signal HVGATE. Input 86 is coupled to both the collector and base of a transistor 106 which in turn has an emitter coupled to line 14. Input 86 is further connected to a resistor divider network that is tied to ground and includes resistors 92, 94 and 96. A transistor 90 has a base coupled between resistors 92 and 94 and further includes a collector coupled to input 86 via resistor 88. Transistor 90 further has an emitter coupled to line 70 for supplying signal HVDRAIN. In addition, line 60 is connected between resistors 94 and 96 and provides a signal identified as HVDRIVE.

Bias circuitry 26 further includes transistors 110, 112 and 116, all of which have a source coupled to ground. Transistor 110 has a drain coupled to the drain of transistor 104 and a gate coupled to the gate of transistor 112 and line 60. Transistor 112 has a drain coupled to line 16 and gate coupled to line 60 and the input of inverter 114. Transistor 116 has a gate coupled to an output of the inverter 114 and a drain tied to line 66 for providing signal HVPDB.

To program the memory cell 10, a high voltage pulse is applied to the HVGATE input pin 86 in the memory cell bias circuitry 26. The memory cell bias circuitry 26 generates voltages required for signals HVDRAIN, HVDRIVE and INPROG which are programming signals. To facilitate memory cell programming, bias circuitry 26 has circuitry to generate and route drain and gate programming voltages. For example, with a 15 volt programming pulse applied as signal HVGATE to input 86, INPROG voltage is approximately 14.3 volts. The diode connected transistor 106 drops the HVGATE voltage by one base-to-emitter voltage ($V_{be}$) and isolates programming circuitry from the INPROG signal during normal operation. Resistors 92, 94 and 96 and 88 and transistor 90 form a voltage divider and buffer to supply nominally 10 volts to signal HVDRAIN. The voltage tap between resistors 94 and 96 provides gate voltage to n-channel transistors 110 and 112 and also provides gate drive to memory cell transistor 58. Transistors 110 and 112 disable memory cell bias circuitry during programming, while resistor 108 isolates the low-voltage bias circuitry from high voltages that may be present during programming.

The preferred physical mechanism by which the PMT is programmed is hot carrier injection from the MOSFET drain-substrate depletion region and subsequent storage in its gate region. Referring to FIG. 2, to effect the hot carrier injection in transistor device 44, once the memory cell is addressed, a programming pulse via memory cell bias circuitry 26-simultaneously applies high voltage to memory cell pins 70, 60 and 14 which provide signals HVDRAIN, HVDRIVE and INPROG, respectively. As a result, transistors 58 and 76 conduct current thereby placing HVDRAIN voltage across the drainsource of the PMT transistor device 44, while the pulse on INPROG forces transistor device 44 gate voltage to an elevated level. As the transistor device 44 achieves avalanche breakdown, electrons generated are accelerated into its gate oxide region by a large electric field across the gate oxide. As a result of this negative charge in the gate oxide region, the effective threshold voltage ($V_t$) of the PMT device is increased to the range of 5–6 volts. The effect of an elevated transistor device 44 voltage $V_t$ on the memory cell is that transistor device 44 stops conducting current and current mirror device 48 goes into compliance thereby forcing the gate voltage of transistor 52 to supply voltage $V_{DD}$. This turns transistor 52 "off" and current source transistor 54 forces the input of inverter 56 to voltage $V_{SS}$, thus forcing the Q output on-pin 20 to a logic "1" state.

A description of the programmed state verification feature of the present invention is provided as follows. After programming and with the memory cell addressed (e.g., row and column decode signals set to logic "1" state), and a voltage applied to signal HVDRAIN input, minimum memory cell programming margin is verified by sensing current through the memory cell HVDRAIN pin 70. Signal HVGATE is forced to 6.5 volts in the bias circuitry 26. Under this condition, there is approximately 4.4 volts across the drain-source of transistor 44 and approximately 5.8 volts on its gate. If the programming operation was not successful, i.e., the PMT device was not programmed or is only partially programmed with an insufficiently elevated voltage $V_t$, current will flow in the HVGATE pin 86. This current flow, which is large compared to the current flowing through resistor 108, will be sensed and will generate an error flag during part calibration. The error flag indicates a faulty PMT programming attempt or a PMT device that will not accept programming.

Conversely, a properly programmed transistor 44 will not conduct current under conditions described above as its voltage $V_t$ is increased during programming to a point that zero current flow occurs in transistor 44. Therefore, by sensing current flow through the memory cell HVDRAIN pin 70, it may be determined immediately after programming whether the PMT device has been programmed to a sufficiently high threshold voltage. This minimum voltage level may be varied by the voltage applied to the HVGATE pin 86 during the program voltage verification operation as described herein.

A description of the unprogrammed state verification feature of the present invention is as follows. The MARGINB pin 30, which is normally set to a logic "one" state, is used to activate margin verification in unprogrammed memory cells. As previously described, the memory cell 10 achieves its unprogrammed Q output equal to logic "zero" state through a combination of the memory cell systematic input offset voltage and a differential input bias voltage design. The p-channel MOS transistor 32 is employed to short transistor 34 from collector-to-emitter. The MARGINB signal is active low, therefore a logic zero on this input activates the margin verification function. Under this condition, the differential input bias voltage appearing between memory cell pins 14 and 16 for signals INPROG and INBIAS, respectively, is decreased by the on-voltage of transistor 34, which equals approximately 300–700 mV. During unprogrammed state margin verification, the effective memory cell offset voltage is comprised of the sum of the comparator systematic input offset voltage plus the resistance of resistor 36 multiplied by current $I_{ref}$, which equals 300 mV plus 200 mV, respectively, for a total of 500 mV, according to the present example.

Memory cell unprogrammed output state is verified as follows. If the memory cell output state changes state upon assertion of the MARGINB signal, i.e., activation of margin detection circuitry, the memory cell 10 has insufficient unprogrammed state margin and the part is rejected. If the output voltage does not change upon low assertion of the MARGINB signal, the memory cell has adequate margin and will therefore have minimum margin in the range of 320–750 mV during normal operation.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

What is claimed is:

1. A programmable memory cell having programming voltage margin verification, said memory cell comprising:

a voltage comparator having a differential input including a first input and a second input;

bias circuitry coupled to the first and second inputs of the comparator for generating the differential input voltage;

a voltage offset applied to the second input of the comparator so as to provide an input offset voltage;

an output for providing a memory cell output signal;

a programming input for receiving a programming voltage so as to program the memory cell;

margin detection circuitry having an input for receiving a verification signal to check unprogrammed state voltage margin;

a current sensor for sensing current flow through the programming input; and means for determining a proper programmed state voltage margin of the memory cell based on the sensed current.

2. The memory cell as defined in claim 1 wherein said bias circuitry includes an input transistor.

3. The memory cell as defined in claim 1 wherein said programming input further receives a pretest voltage less than the programming voltage, said pretest voltage allowing a pretest programming check prior to permanent programming of the memory cell.

4. The memory cell as defined in claim 1 wherein said output is coupled to a digital-to-analog converter.

5. A programmable memory cell having programming voltage margin verification, said memory cell comprising:

a voltage comparator having a differential input including a first input and a second input;

bias circuitry coupled to the differential input for generating a differential input voltage;

a voltage offset applied to the second input of the comparator so as to provide an input offset voltage;

an output for providing a memory cell output signal;

a programming input for programming the memory cell;

a current sensor for monitoring current flow through the programming input; and means for determining a proper programmed state voltage margin of the memory cell based on the sensed current.

6. The memory cell as defined in claim 5 further comprising margin detection circuitry having an input for receiving a verification check signal to check unprogrammed state voltage margin.

7. A programmable memory cell having programming voltage margin verification, said memory cell comprising:

a voltage comparator having a differential input including a first input and a second input;

bias circuitry coupled to the first and second inputs of the comparator for generating a differential input voltage;

an output for providing a memory cell output signal;

a programming input for receiving a programming voltage so as to program the memory cell; and margin detection circuitry having an input for receiving a verification check signal to check unprogrammed state voltage margin.

8. The memory cell as defined in claim 7 further comprising:

a current sensor for monitoring current flow through the programming input; and means for determining a proper programmed state voltage margin of the memory cell based on the sensed current.

9. A method of verifying programmed voltage margin of a memory cell, said method comprising the steps of:

addressing at least some of a plurality of memory cells;

programming said at least some of the memory cells;

applying a verification check signal to a margin detection circuit to check an unprogrammed state margin for unprogrammed memory cells;

monitoring an output of each of said memory cells;

sensing current flow through a memory cell programming input for said programmed memory cells; and determining a proper programmed state of the programmed memory cells based on the sensed current.

* * * * *